United States Patent [19]

Erdle

[11] Patent Number: 4,517,406

[45] Date of Patent: May 14, 1985

[54] LAMINATED BUS BAR CONTAINING MULTILAYER CERAMIC CAPACITORS

[75] Inventor: Jack A. Erdle, Rochester, N.Y.

[73] Assignee: Eldre Components, Inc., Rochester, N.Y.

[21] Appl. No.: 610,097

[22] Filed: May 14, 1984

[51] Int. Cl.³ .............................................. H01B 7/00
[52] U.S. Cl. .................................. 174/72 B; 361/306
[58] Field of Search ............. 174/72 B; 361/306, 328, 361/329, 330, 407

[56] References Cited

U.S. PATENT DOCUMENTS

| | | | |
|---|---|---|---|
| 3,778,735 | 12/1973 | Steenmetser | 174/72 B X |
| 4,266,091 | 5/1981 | Fukuda | 174/72 B |
| 4,399,321 | 8/1983 | Gottlieb | 174/72 B |
| 4,430,522 | 2/1984 | Bader | 174/72 B |

*Primary Examiner*—Laramie E. Askin
*Attorney, Agent, or Firm*—Shlesinger, Fitzsimmons & Shlesinger

[57] ABSTRACT

One or more multilayer ceramic capacitors are positioned in a laminated bus bar so that a pair of opposed, external electrodes on each capacitor are positioned in substantially coplanar engagement with the confronting, plane surfaces of adjacent conductor strips in the bar. The two external electrodes of each capacitor are connected each to a different one of two, spaced metal termination plates, which are mounted on each capacitor to interconnect its alternate and intervening electrodes, respectively. The two termination plates of each capacitor register with spaced recesses or openings formed in each of the adjacent conductor strips to accommodate any projections on the termination plates and thereby permit coplanar engagement of said external electrodes with said conductor strips.

11 Claims, 8 Drawing Figures

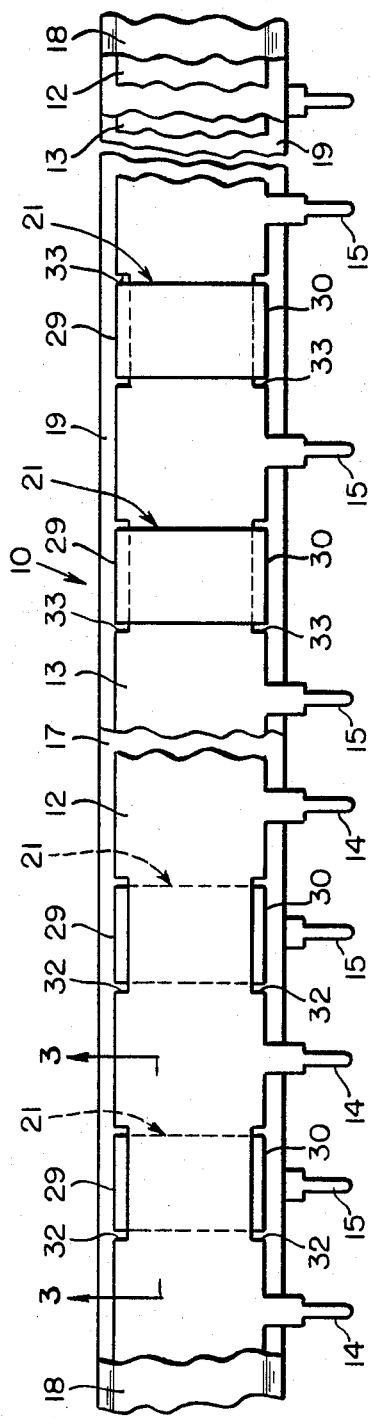
FIG. 1
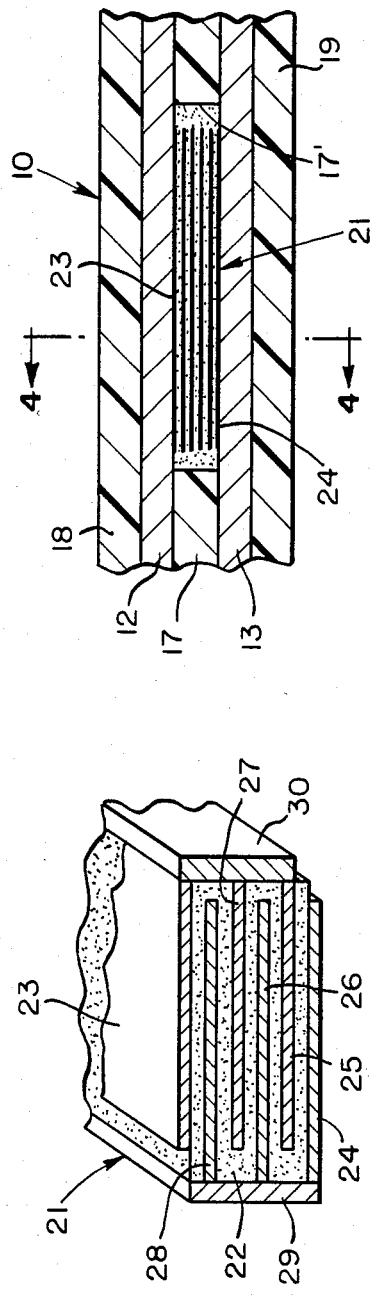
FIG. 3
FIG. 2

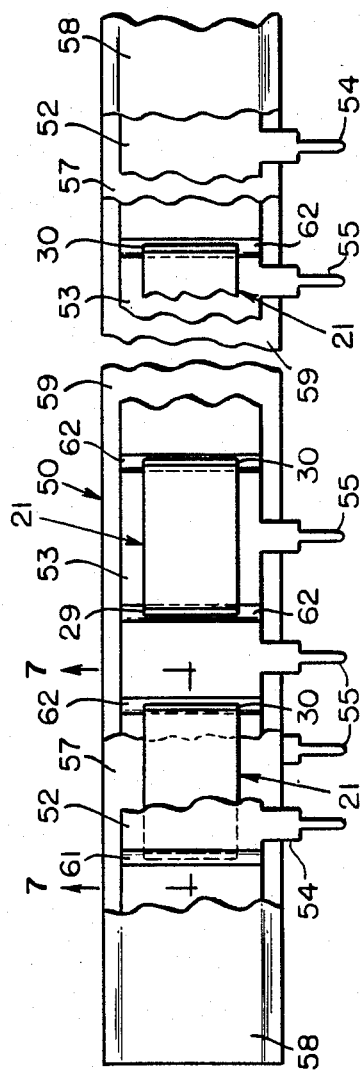
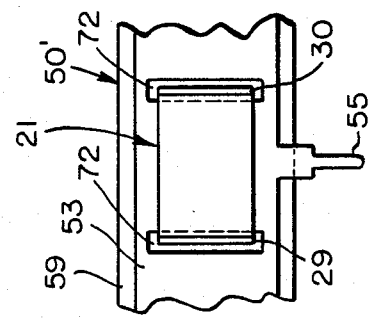
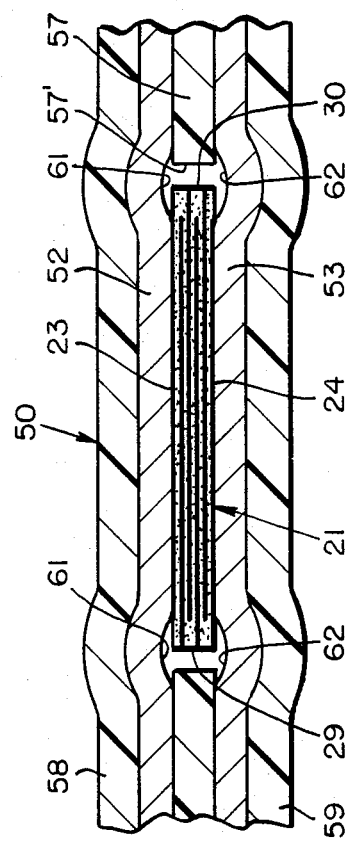
FIG. 6
FIG. 8
FIG. 7

LAMINATED BUS BAR CONTAINING MULTILAYER CERAMIC CAPACITORS

BACKGROUND OF THE INVENTION

This invention relates to laminated bus bars, and more particularly to a high capacitance bus bar in which a plurality of multilayer ceramic capacitors are positioned in the bar between adjacent conductor strips. Even more particularly, this invention relates to improved bus bars containing multi-layer ceramic capacitors which are mounted in the bars in such manner that they are capable of withstanding very high laminating pressures without fracturing.

One of the major problems heretofore encountered in the production of laminated bus bars of the type containing ceramic capacitors has been the tendency of the capacitors readily to fracture during the lamination process, or even during subsequent use. With proper manufacturing procedures this problem can be substantially obviated when single layer capacitors are employed, such as taught for example by U.S. Pat. Nos. 3,778,735; 4,266,091 and 4,430,522. Moreover, even when multilayer ceramic capacitors are employed in such bus bars, the problem can be minimized provided the capacitors or chips are mounted in registering openings in the metal strip conductors to which they are connected, as shown for example in U.S. Pat. No. 4,399,321.

Heretofore, however, it has not been possible satisfactorily to incorporate multilayer capacitors of the ceramic variety directly between and in contact with the adjacent strip conductors of the laminated bus bar. In such cases the ceramic capacitors are usually fractured by the laminating forces which are transmitted by the metal conductor strips directly against the opposed surfaces of the ceramic capacitors. It has been discovered that a primary reason for this fracture is attributable to the presence of the relatively thick, metal end terminations, which are formed on opposite ends of the capacitor to interconnect its alternate and intervening electrode layers, respectively. When these end terminations are stressed during lamination, the forces applied thereto tend to shatter or fracture the capacitor.

It is an object of this invention, therefore, to provide an improved, laminated bus bar containing multilayer ceramic capacitors which are sandwiched directly between adjacent conductor strips of the bar.

Another object of this invention is to provide improved laminated bus bars of the type described which are designed to prevent laminating pressures from being applied to the electrode terminations of the ceramic capacitors in the bar, and also to prevent any undesirable shorting of the terminations on adjacent conductors.

Still a further object of this invention is to provide an improved multilayer ceramic capacitor which is particularly suited for use in laminated bus bars of the high capacitance variety.

Other objects of the invention will be apparent from the specification and from the recital of the appended claims.

SUMMARY OF THE INVENTION

Multilayer ceramic capacitors as used herein are especially made to have a pair of external electrodes formed on two, opposed, planar surfaces thereof, and with each such electrode connected to one of two metal termination plates that extend along the opposed side or end edges of the capacitor. In one embodiment the capacitors are laminated between conductor strips at spaced points along the length of a bar with their termination plates extending parallel to the longitudinal side edges of the bar, and projecting into registering notches or recesses formed in the longitudinal side edges of the conductor strips, whereby the two external electrodes of each capacitor are disposed in coplanar engagement with the confronting surfaces of adjacent conductor strips in the bar.

In another embodiment the termination plates extend transversely of the bus bar and seat in, or project into, registering recesses or openings formed in the conductor strips at spaced points along their lengths. In each embodiment the adjacent conductor strips may be separated by the capacitors, or preferably by a layer of insulation containing windows or openings for accommodating the capacitors.

THE DRAWINGS

FIG. 1 is a fragmentary plan view of a laminated bus bar made according to one embodiment of this invention, portions of the bar being cut away to illustrate the capacitors positioned within the bar at spaced points along its length;

FIG. 2 is a greatly enlarged, fragmentary perspective view of a monolithic ceramic capacitor of the type employed in the bus bar of FIG. 1;

Figure 4:
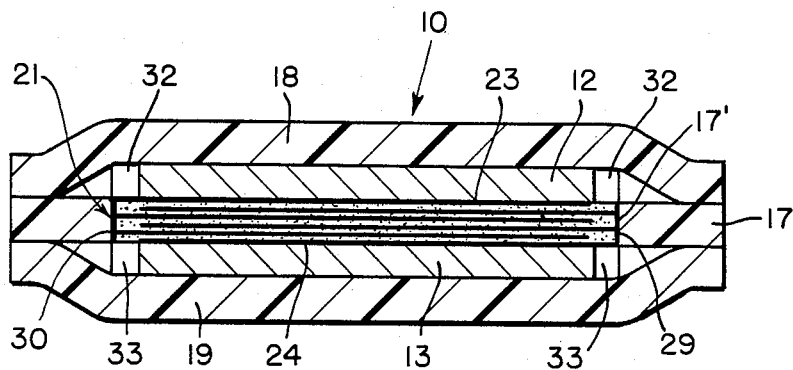
Figure 5:
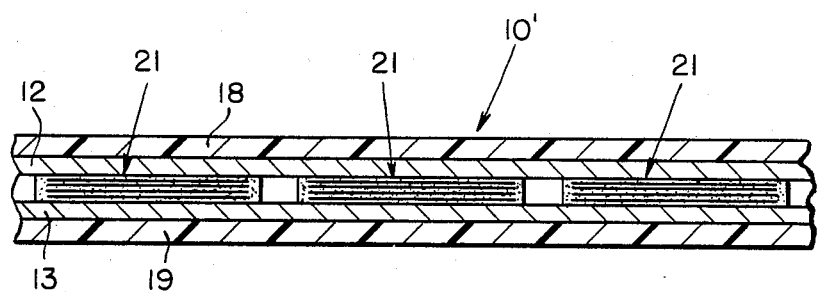

FIGS. 3 and 4 are enlarged, fragmentary sectional views taken generally along the lines 3-3 in FIG. 1 and 4-4 in FIG. 3, respectively, looking in the directions of the arrows;

FIG. 5 is a fragmentary sectional view similar to FIG. 3, but showing a modified form of bus bar;

FIG. 6 is a fragmentary plan view of a bus bar made in accordance with a third embbodiment of this invention;

FIG. 7 is an enlarged, fragmentary sectional view taken generally along the line 7-7 in FIG. 6; and FIG. 8 is a fragmentary plan view of part of a bus bar made according to still another embodiment of this invention.

DETAILED DESCRIPTION OF THE PREFERRED EMBODIMENTS

Referring now the drawings by numerals of reference, and first to FIGS. 1 to 4, 10 denotes generally a laminated bus bar comprising a pair of elongated, flat, metal conductors or strips 12 and 13, each of which has projecting from at least one longitudinal side edge thereof the usual spaced terminals or tabs 14 and 15, respectively. The conductive strips 12 and 13, which typically are made from copper, are separated in this first embodiment by a layer 17 of dielectric insulation, the longitudinal side edges of which project slightly beyond the registering side edges of the conductors 12 and 13. Two outer, encapsulating dielectric layers 18 and 19, which overlie the outer surfaces of the strips 12 and 13, respectively, also have their side edges extending beyond the conductor strips 12 and 13 to be laminated in the usual manner to the side edges of the insulating layer 17.

Sandwiched between strips 12 and 13 at longitudinally spaced points along the bar 10 are several, like, multilayer ceramic capacitors 21, each of which is positioned in a registering opening 17' (FIGS. 3 and 4) in layer 17. As shown in FIG. 2, each capacitor 21 comprises a dielectric ceramic substrate or matrix 22 which is generally rectangular in cross section. Secured or otherwise deposited on two of its opposed, outer surfaces (the upper and lower surfaces as shown in FIG. 2) are two, thin, parallel electrodes 23 and 24, each of which covers part only of the associated substrate surface. Embedded in substrate 22 in spaced, parallel relation to each other, and to the outer electrodes 23 and 24, are four additional electrodes 25, 26, 27 and 28.

As shown in FIG. 2, alternate electrodes 24, 26, and 28 extend to and open upon only one side edge (the left edge) of the substrate, while the intervening electrodes 23, 25 and 27, on the other hand, extend to and open upon only the right hand side edge of substrate 22. Along the left side of substrate 22 the alternate electrodes 24, 26 and 28 are terminated upon the first metal termination plate 29 that extends transversely of the electrodes along the left side of substrate 22, while the intervening electrodes 23, 25 and 27, on the other hand, are terminated upon a second metal termination plate 30, which extends along the side of substrate 22 remote from plate 29.

The particular process by which the ceramic capacitors or chips 21 are manufactured forms no part of this invention, apart from the fact that each of the opposed, outer surfaces that form the top and bottom of the chip substrate 22 are covered by two different electrodes 23 and 24, which are terminated, respectively, along opposite edges or ends of the substrate to the different termination plates 30 and 29 respectively. The substrate 22 may be of a well known barium titanate composition of the type frequently employed for making multilayer ceramic capacitors.

Referring again to FIG. 1, it will be noted that each of the metal conductor strips 12 and 13 has formed in each of its longitudinal side edges a plurality of spaced, shallow notches, or recesses 32 and 33, respectively, and the capacitors or chips 21 are positioned between conductors 12 and 13 so that their termination plates 29 and 30 extend parallel to and register with, the recesses 32 and 33 in conductor strips. The advantage of this configuration is that the capacitor termination plates 29 and 30, which normally are somewhat larger or bulkier than the attached electrodes, can project into the spaces formed in the bar 10 by the recesses 32 and 33, thus preventing any undue stress or strain on the respective ceramic chips 21 during a laminating operation. At such time most of the laminating pressure will be applied through the conductor plates 12 and 13 directly against the plane, parallel outer electrode surfaces 23 and 24 of the chips, so that most of the compressive forces are directed at right angles to these electrodes and to the associated chips. This minimizes the tendency of the chips to fracture or otherwise become damaged during the laminating operation. Moreover, it permits the entire, opposed, outer electrode layers 23 and 24 to be placed into direct, coplanar contact with the confronting surfaces on the conductors as compared, for example, to capacitors of the type of which only have one outer electrode, and the end terminations of which are soldered each to a different one of the conductors strips in the bar.

In FIG. 5, 10' denotes a modified form of the bus bar in which the intervening insulating layer 17 is eliminated, and the numerous chips 21 are instead secured directly between the two conductive strips 12 and 13 in longitudinally spaced relation to each other. In this embodiment the chips 21 are spaced so closely together that they prevent any contact between the strips 12 and 13, which might otherwise cause shorting of the bar.

Referring now to the embodiment shown in FIGS. 6 and 7. 50 denotes generally a bus bar comprising a pair of elongated metal strips or conductors 52 and 53 which, as in the case of the first embodiment, have projecting from at least one longitudinal side edge thereof a plurality of spaced tabs or terminals 54 and 55, respectively. Also as in the case of the first embodiment the two conductor strips 52 and 53 are separated or insulated from one another by an intervening layer 57 of a plastic, dielectric material the marginal side edges of which project laterally beyond the registering side edges of the strips 52 and 53. The outer surfaces of the strips 52 and 53, as in the first embodiment, are covered by layers 58 and 59, respectively, of plastic, dielectric material, the marginal side edges of which are adapted to be sealingly laminated in the usual manner to the side edges of the intervening layer 57 of insulation to seal the assembly.

Sandwiched between the confronting surfaces of the conductors 52 and 53 is a plurality of multilayer capacitors or chips 21, which are similar in construction to those employed in the first embodiment. Each chip 21 is positioned in one of several axially spaced openings 57' (FIG. 7) in the central insulating layer 57 so that the opposed, outer electrodes 23 and 24 of each chip face the confronting surfaces of the adjacent conductor strips 52 and 53, respectively. Unlike the first embodiment, however, the termination plates 29 and 30 of each strip 21 extend transversely of the respective conductors 52 and 53, and have the upper and lower edges thereof registering with, and projecting into, a plurality of spaced, parallel, transversely extending, recesses or ripples which are formed as at 61 and 62, respectively, at longitudinally spaced points along the confronting surfaces of the conductors 52 and 53, respectively. As a consequence, the opposed, outer electrodes 23 and 24 are positioned in coplanar engagement with the inner, confronting surfaces of the conductor strips 52 and 53, respectively, whereby most efficient use of the capacitors 21 is again made. Moreover, since the confronting surfaces of the conductor strips 52 and 53 do not come into engagement with the termination plates 29 and 30, substantially all of the compression forces during lamination are directed at right angles to the plane surfaces of the chips 21, so that fracture of the chips during lamination is substantially eliminated.

If desired, the intervening insulation layer 57 or its equivalent could be omitted from the bar 50, provided that the chips 21 are employed in such closely spaced relation that they would preclude any engagement between the conductor strips 52 and 53. Moreover, while the recesses or undulations 61 and 62 in the conductor strips 52 and 53 are shown to extend completely transversely across each strip, it will be readily apparent to one skilled in the art that, if desired, they could be made as at 72 in conjunction with bar 50' in FIG. 8 to extend only part way toward the edges of each conductor strip, provided, of course, that each such recess 72 would be long enough to accommodate the edge of one of the termination plates 29 or 30. Alternatively, instead of forming recesses 72 in the confronting surfaces of adjacent conductors 52 and 53, the conductors could have therethrough registering openings similar in configuration to recesses 72, thereby to accommodate the termination plates 29, 30.

In addition to the above-noted advantages, the laminated bus bars disclosed herein permit the use of multilayer or monolithic capacitor chips which have rather rough, inexpensive termination plates 29 and 30, such as for example those simply made from solder, the reason being that the terminations would not be subjected to any particular stress during assembly and use in the bars disclosed herein. Moreover, this invention could obviate the need for employing any adhesive whatsoever in order to position the chips at spaced points along the respective bars. In other words, to the extent that the termination plates 29 and 30 project into the registering recesses in the confronting conductor plates 12, 13, or 52, 53, the chips can be readily and properly positioned longitudinally of the conductor strips during assembly.

Furthermore, by placing the capacitors in openings 17' or 57' in the intervening layers 17 or 57 of insulation, the capacitors are prevented from shifting or rotating in the bar into shorting contact with the adjacent conductor strips, thus eliminating any breakdown in the capacitance of the bar. Also, the surrounding insulation layer 17 or 57 serves completely to seal each capacitor hermetically in a respective bar.

While only certain embodiments of this invention have been illustrated and described in detail herein, it will be apparent that this invention is capable of still further modification, and that this application is intended to cover any such modifications as may fall within the scope of one skilled in the art or the appended claims.

I claim:

1. A laminated bus bar having therein a pair of elongate, metal conductor strips, and at least one multilayer capacitor sandwiched between said strips, and wherein the improvement comprises
a pair of spaced, parallel external electrodes on said capacitor having coplanar engagement with confronting surfaces on said strips, and
a pair of spaced metal termination plates on said capacitor extending transversely of said external electrodes and electrically connected each to a different one of said external electrodes,
each of said termination plates having opposed edges thereof confronting upon said metal strips, and
each of said metal strips having therein a pair of spaced recesses registering with the confronting edges of said termination plates.

2. A laminated bus bar as defined in claim 1, wherein said spaced recesses comprise a pair of laterally registering notches formed in the opposed, longitudinal side edges of each of said metal strips.

3. A laminated bus bar as defined in claim 1, wherein said spaced recesses extend transversely of each of said strips from adjacent one side edge thereof at least part way toward the other side edge thereof.

4. A laminated bus bar as defined in claim 1, wherein a plurality of said multilayer capacitors are secured between said conductors at spaced points along the length of said bar,
each of said metal strips has therein a plurality of pairs of said spaced recesses, and
each of said pairs of recesses in one of said strips is disposed to register with a like pair of recesses in the other of said strips, and with the termination plates on one of said capacitors.

5. A laminated bus bar as defined in claim 4, including a layer of dielectric insulation interposed between and separating said pair of metal conductor strips in the bus bar, said layer having therein a plurality of spaced openings for accommodating said capacitors, and
each of said capacitors being positioned in one of said openings in said layer and having at least portions of said external electrodes thereof extending beyond said layer and into coplanar engagement with said strips.

6. A laminated bus bar as defined in claim 4, wherein said spaced recesses comprise a plurality of equi-spaced notches formed in each of the longitudinal side edges of each of said metal strips.

7. A laminated bus bar as defined in claim 4, wherein said spaced recesses comprise a plurality of spaced, transversely extending undulations formed in each of said metal strips.

8. A laminated bus bar, comprising
a pair of elongate, metal conductors,
means enclosing said conductors hermetically and in insulated relation to each other in a flexible, dielectric insulating jacket, and with at least portions of said conductors having thereon confronting, plane surfaces, and
a multilayer capacitor secured between a pair of said confronting surfaces on said conductors,
said capacitor comprising a dielectric ceramic substrate having thereon a pair of opposed, external electrodes disposed in substantially coplanar engagement with said pair of confronting surfaces on said conductors, and having thereon a pair of spaced, metallic termination plates extending transversely between said conductors and electrically connected each with a different one of said electrodes, and
said conductors having therein spaced recesses registering with said termination plates.

9. A laminated bus bar as defined in claim 8, wherein said recesses in said conductors comprise spaced openings formed in said conductors to register with and to accommodate any portions of said termination plates which project transversely beyond the space between said pair of confronting surfaces on said conductors.

10. A laminated bus bar as defined in claim 8, wherein said recesses are formed in the confronting surfaces of said conductors to extend only part way transversely thereof.

11. A laminated bus bar as defined in claim 10, wherein said recesses constitute registering openings extending through said conductors intermediate the longitudinal side edges thereof.

* * * * *